US005259769A

United States Patent [19]

Cruise et al.

[11] Patent Number: 5,259,769

[45] Date of Patent: Nov. 9, 1993

[54] ELECTRICAL CONNECTOR WITH PRELOADED SPRING-LIKE TERMINAL WITH IMPROVED WIPING ACTION

[75] Inventors: Tom Cruise; Mathew Wilhite, both of Limerick; Niallo D. Carroll, Dublin, all of Ireland

[73] Assignee: Molex Incorporated, Lisle, Ill.

[21] Appl. No.: 954,859

[22] Filed: Sep. 29, 1992

[51] Int. Cl.[5] .................... H05K 1/00

[52] U.S. Cl. .................... 439/65; 439/746

[58] Field of Search .................... 439/66, 86, 91, 81, 439/82, 70–73, 62, 65, 746, 626

[56] References Cited

U.S. PATENT DOCUMENTS 3,858,154 12/1974 William .................... 439/66

3,960,424 6/1976 Wisenburger .................... 439/66

4,664,458 5/1987 Worth .................... 439/66

OTHER PUBLICATIONS

"Beacon Connector", Brown Engineering Co. 439/66 Dec. 1961.

*Primary Examiner*—David L. Pirlot

*Attorney, Agent, or Firm*—Stephen Z. Weiss

[57] ABSTRACT

An electrical connector includes a dielectric body mounting a flexible leaf-type terminal which has a spring contact portion for surface engagement with a contact element of a mating connector component. The body includes a partition-like wall defining oppositely facing sides and an end face thereof. The terminal is fixed adjacent one side of the wall, and the spring contact portion of the terminal is bowed around the end face of the wall and spaced therefrom for flexingly surface engaging the contact element of the mating connector component in a given direction generally perpendicular to the end face of the wall. The terminal has a distal end at the end of the spring contact portion located in a recessed area in the other side of the wall. The distal end thereby preloads the spring contact portion and resists flexing of the spring contact portion if engaged in a direction generally toward the one side of the wall.

8 Claims, 3 Drawing Sheets

ELECTRICAL CONNECTOR WITH PRELOADED SPRING-LIKE TERMINAL WITH IMPROVED WIPING ACTION

FIELD OF THE INVENTION

This invention generally relates to the art of electrical connectors and, particularly, to an electrical connector which has a flexible terminal having a spring contact portion which is preloaded and which provides a wiping action upon engagement with a second contact element.

BACKGROUND OF THE INVENTION

There are a variety of electrical connectors which have flexible terminals with spring contact portions provided for surface engagement with a contact element of a mating connector component. Although, theoretically, any pair of interengaging contacts necessarily are surface engageable, such terms as "surface engagement" or the like herein are meant to define interengaging contacts wherein the contact surfaces engage in a generally perpendicular or abutting relationship, versus contacts which slide over each other during mating such as pin and socket contacts.

For instance, in a portable or mobile telephone apparatus, a handset conventionally is inserted into a cradle, whereby fairly rigid, usually planar, contacts are moved into abutment ("surface engagement") with flexible contacts in the cradle of the base unit. Another example is in a battery charger for various applications, such as telephones, video recorders, or the like, wherein a battery pack has fairly rigid planar contacts movable into abutting surface engagement with flexible contacts of a battery recharger.

In such environments as mobile telephone apparatus, video recorder applications and the like, it can be understood that contamination of the contact surfaces is an ongoing problem. Consequently, even though the contacts are surface engageable or abutting during mating, it is desirable to provide some sort of wiping action between the contacts to facilitate a better electrical connection therebetween. In order to provide a wiping action, the flexible contact usually is designed to provide some sort of transverse movement during flexing, i.e. transverse to the generally perpendicular direction of engagement of the contacts. Providing such movement creates further problems in that the use of surface engageable contacts, in such applications or environments as described above, exposes the contacts to engagement by foreign objects which may deform the contacts. This problem further is compounded when it is desirable to preload the flexible contacts so that they provide a given interengaging force with their mating contacts, and any deformation of the flexible contacts would destroy the particular preload.

This invention is directed to solving these problems by providing a surface engageable contact system wherein the interengaging contacts have a wiping action during mating, wherein the flexible contact is provided with a preload, and wherein means are provided for resisting flexing of the flexible contact if engaged in a direction other than the intended abutting direction of the mating rigid contact.

SUMMARY OF THE INVENTION

An object, therefore, of the invention is to provide an electrical connector of the character described, with a new and improved "surface engageable" contact or terminal.

In the exemplary embodiment of the invention, an electrical connector is provided with a dielectric body mounting a flexible terminal which has a spring contact portion for surface engagement with a contact element of a mating connector component. The body includes a partition-like wall defining oppositely facing sides and an end face thereof. The terminal is fixed adjacent one side of the wall. The spring contact portion of the terminal is bowed around the end face of the wall and spaced therefrom for flexingly surface engaging the contact element of the mating connector component in a given direction generally perpendicular to the end face of the wall.

The invention contemplates that the terminal have a distal end at the end of the spring contact portion and which is located in a recessed area in the other side of the wall to capture the end of the spring contact portion. The captured distal end of the terminal preloads the spring contact portion and resists flexing of the spring contact portion if engaged in a direction other than the given direction generally perpendicular to the end face of the wall.

In the specific embodiment of the invention, the terminal includes a generally flat leg portion fixed against the one side of the wall of the body, a spacer leg portion projecting outwardly from the one wall at an end of the flat leg portion, with the spring contact portion being bowed around the end face of the wall from an outer end of the spacer leg portion, and a lip at the distal end of the terminal defined by the end of the spring contact portion, the lip being bent inwardly and at a reverse angle back toward the end face. The recessed area in the other side of the wall is formed by a notch defining a ledge extending into the other side of the wall at a reverse angle toward the end face of the wall. The lip at the distal end of the terminal or spring contact portion seats against the ledge to resist movement of the spring contact portion if engaged on the one side of the wall. The leg portion and the distal end of the terminal are disposed in grooves respectively in the opposite sides of the wall.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
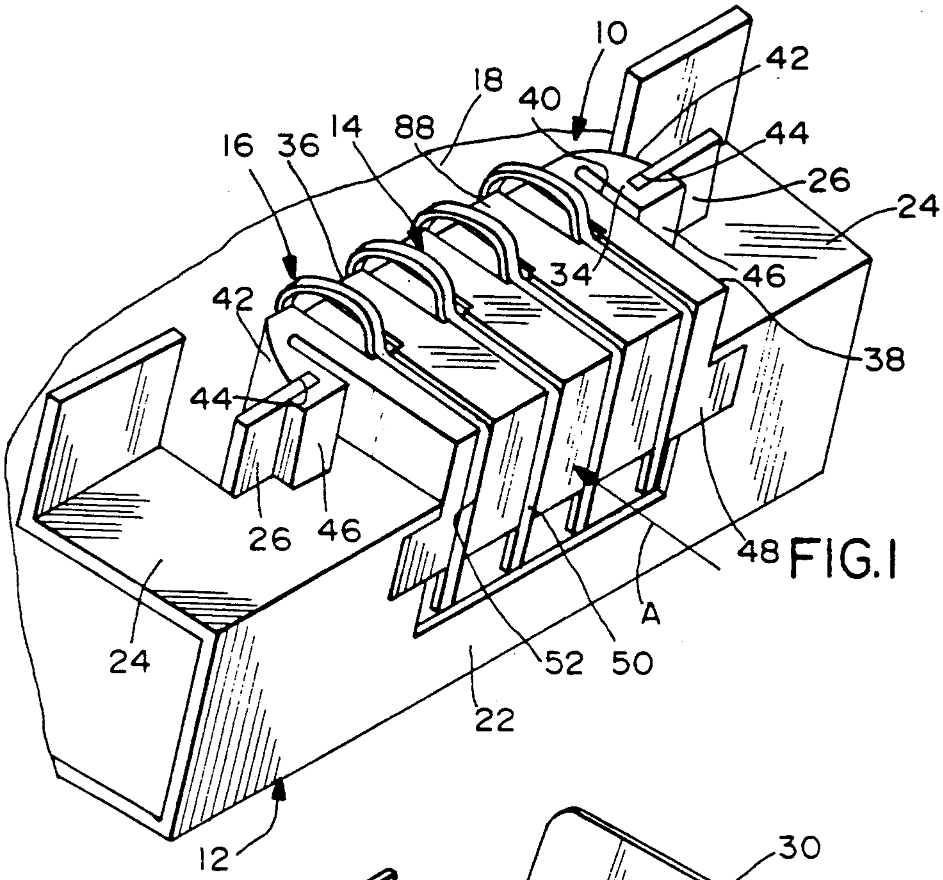
FIG. 1 is a fragmented perspective view looking toward the bottom of an electrical connector embodying the novel terminal of the invention, the connector being mounted on a mounting bracket.

Referring to the drawings in greater detail, FIG. 1 shows an electrical connector, generally designated 10, mounted in a mounting bracket, generally designated 12, of a particular apparatus in which the electrical connector is employed. The connector includes a unitarily molded dielectric body, generally designated 14, which mounts a plurality of flexible leaf-type terminals, generally designated 16. Mounting bracket 12 is unitarily fabricated of stamped and formed sheet metal material and also provides a shielding means for the connector. The connector is mounted to the bracket in the direction of arrow "A" (FIG. 1).

Figure 2:
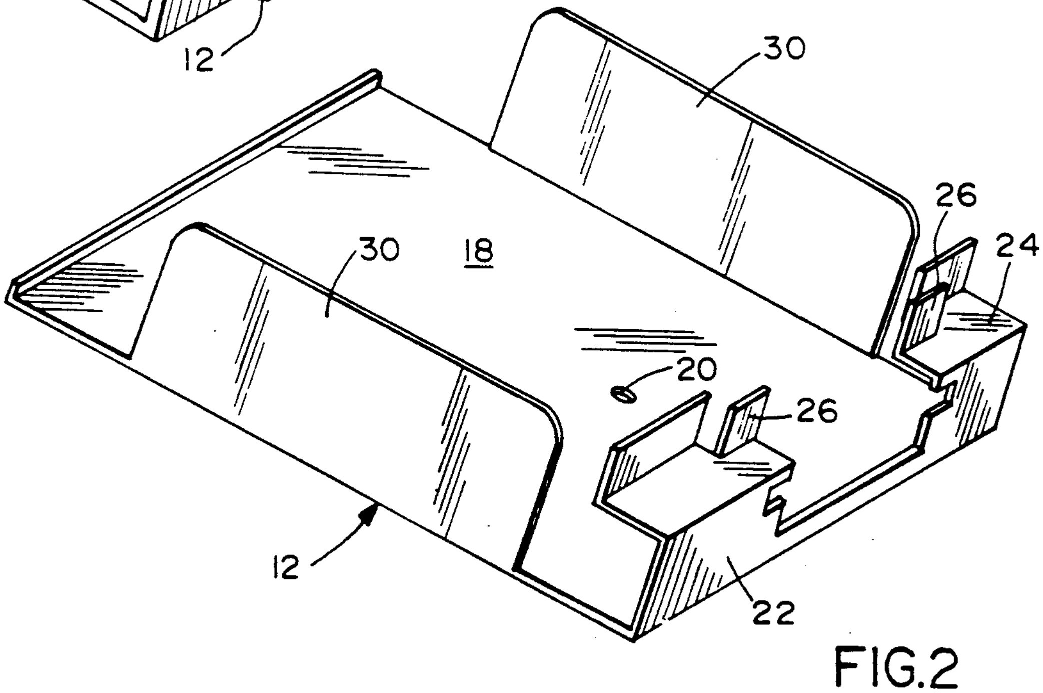
FIG. 2 is a full perspective view of the mounting bracket.

Referring to FIG. 2 in conjunction with FIG. 1, mounting bracket 12 includes a generally planar base wall 18 which may have one or more holes 20 for securing the mounting bracket in a particular apparatus, such as in a base unit of a mobile telephone system. The base wall is joined to a bottom wall 22 which, in turn, is joined to a pair of flanges 24 having outwardly projecting latch wings 26. Flanges 24 and latch wings 26 are on opposite sides of a cut-out area 28 at the bottom of the mounting bracket and into which electrical connector 10 is mounted, as described hereinafter. Lastly, a pair of side flanges 30 project from base wall 18 and reinforce the base wall, particularly for mounting the bracket in its appropriate apparatus.

Figure 3:
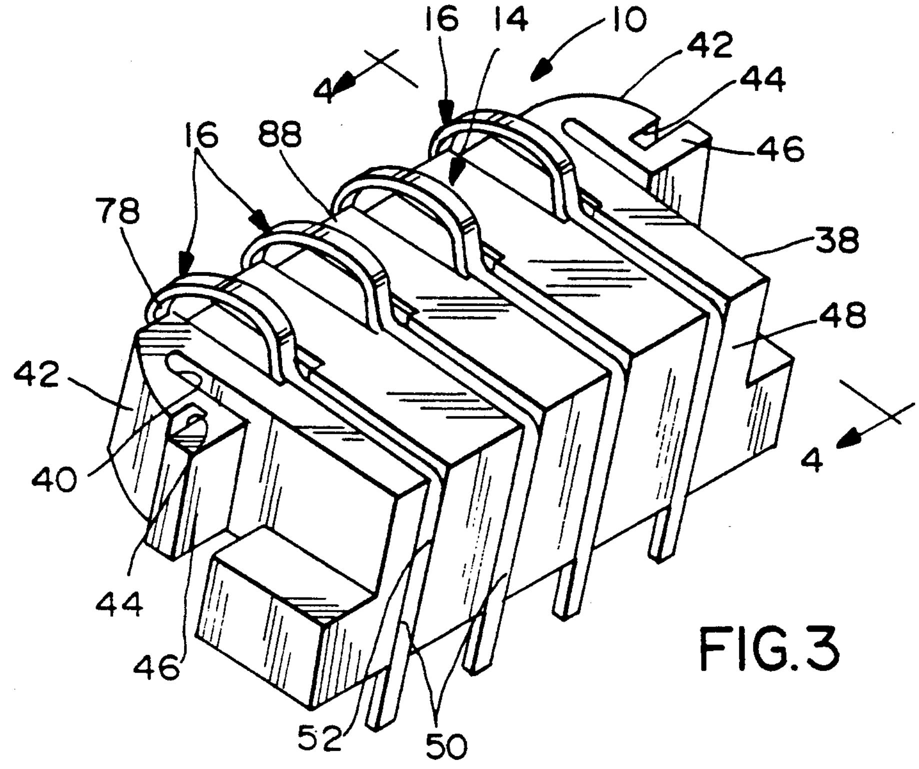
FIG. 3 is a perspective view similar to that of FIG. 1, of the connector isolated from the mounting bracket.

Referring to FIG. 3 in conjunction with FIG. 1, the unitarily molded dielectric housing 14 of connector 10 includes a pair of latch arms 34 which project from a mating face 36 of the body back along opposite sides 38 of the body so as to be spaced, as at 40, from the opposite sides. Therefore, the latch arms are provided with a degree of resiliency or flexibility. Each latch arm 34 includes a beveled outer surface 42 leading to a latch notch 44, and the latch arm terminates in a stop flange 46. Therefore, when connector 10 is mounted to bracket 12 in the direction of arrow "A" as described above in relation to FIG. 1, beveled outer surfaces 42 of latch arms 34 engage latch wings 26 of mounting bracket 12 and bias the latch arms inwardly toward the body of the connector. When the latch wings of the bracket reach latch notches 44 of latch arms 34, the latch arms will snap back outwardly of the body to the latched or mounting positions shown in FIG. 1, with stop flanges 46 abutting against the latch wings.

When connector 10 is fully mounted on bracket 12 as shown in FIG. 1, a bottom surface 48 of dielectric body 14 is flush with the outside of bottom wall 22 of the bracket. This continuous flat surface is mounted on a printed circuit board, as illustrated hereinafter. Each terminal 16 has a solder tail 50 located in a respective groove 52 in bottom surface 48 of the connector body so that the surface of the solder tail is flush with the bottom surface of the dielectric body, whereby the solder tail can be surface connected to an appropriate circuit trace or solder pad on the printed circuit board.

Figure 4:
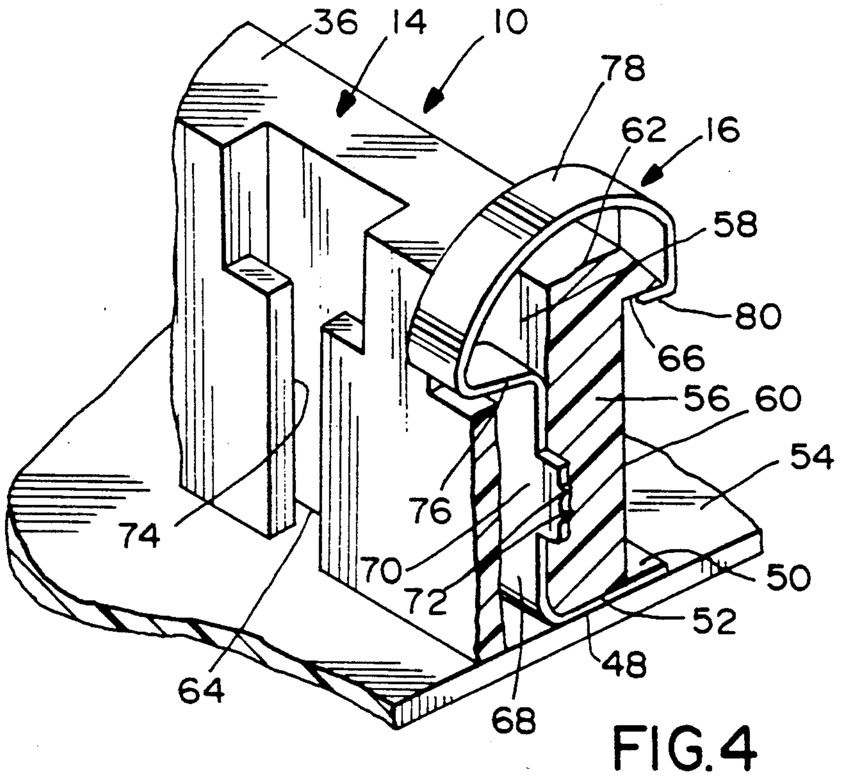
FIG. 4 is a section taken generally along line 4—4 of FIG. 3.

FIG. 4 illustrates a fragmented, sectioned depiction of a portion of dielectric housing 14 of connector 10, isolated from mounting bracket 12, and shows how the connector surface engages a printed circuit board 54, with the solder tail 50 of one of the terminals 16 surface engaging the top of the board. The mounting bracket is not shown in order to avoid cluttering the illustration of surface mounting the terminals to the printed circuit board. Suffice it to say, the top of the board would engage bottom wall 22 of the bracket as described above in relation to FIG. 1, wherein it can be seen that bottom surface 48 of the connector body, the bottom surfaces of solder tails 50 of terminals 16, and bottom wall 22 of the mounting bracket, all are generally coplanar for surface mounting on the printed circuit board.

The novel configuration and mounting of terminals 16 in dielectric body 14 of connector 10 now will be described, and reference is made to FIGS. 4 and 5. First, dielectric body 14 of connector 10 defines a partition-like wall 56 defining oppositely facing sides 58 and 60, along with an end face 62 which coincides with mating face 36 of the body. Grooves 52 for receiving solder tails 50 of terminals 16 are formed in a bottom wall 64 of partition-like wall 56. A recessed area in side 60 of wall 56 is defined by a notch providing a ledge 66 extending into the wall at a reverse angle back toward end face 62 of the wall.

Figure 5:
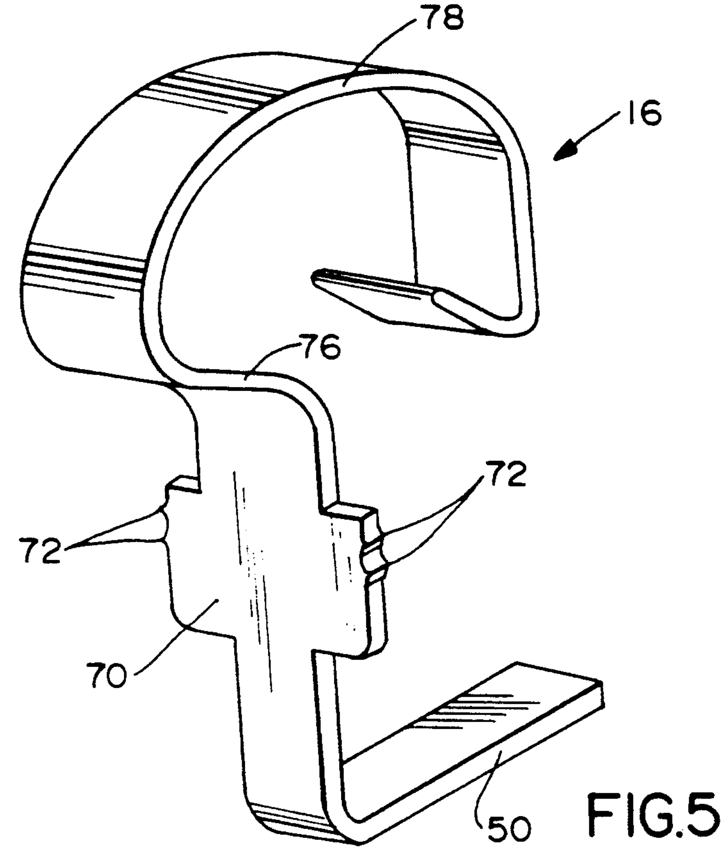
FIG. 5 is a perspective view of one of the novel terminals of the invention.

Referring to FIG. 5 in conjunction with FIG. 4, each terminal 16 can be seen to be a flexible leaf-type terminal which, preferably, is fabricated of stamped and formed sheet metal material. The terminal includes a generally flat leg portion 68 projecting upwardly from solder tail 50 in a sort of L-shaped configuration. The leg has an enlarged area 70 provided with outwardly projecting teeth 72 which are of a width to mount within a respective groove 74 (FIG. 4) in dielectric body 14. The teeth will dig into the plastic material of the body to fix leg 68 against side 58 of wall 56 of the body and, thereby, fixedly mount each terminal 16 to the dielectric body. Each terminal further includes a spacer leg portion 76 projecting outwardly from the upper end of flat leg portion 68 and, thereby, the spacer leg portion projects outwardly from side 58 of wall 56 of the dielectric body. A rounded spring contact portion 78 is bowed from the outer end of spacer leg portion 76 around end face 62 of wall 56 and is spaced from the end face of the wall for flexingly surface engaging a contact element of a mating connector component, as described hereinafter. Lastly, the terminal includes a distal end, at the end of spring contact portion 78, which defines a lip 80. The lip is bent inwardly and at a reverse angle back toward end face 62 of wall 56 so that the lip seats against reverse angle ledge 66 on side 60 of the wall.

Figure 6:
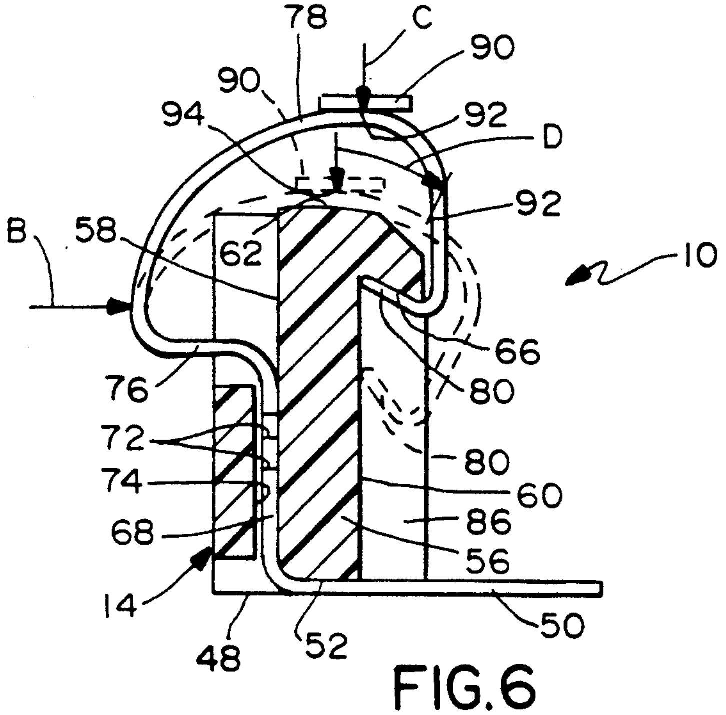
FIG. 6 is a transverse section through the electrical connector and illustrating the position and movement of the spring contact portion of one of the terminals when surface engaged by a contact element of a mating connector component.

With the above description of FIGS. 4 and 5, reference now is made to FIG. 6 wherein one of the terminals 16 is illustrated in full lines in its preloaded, noncontacting position. Again, it can be seen that solder tail 50 of the terminal is disposed in groove 52 at the bottom of dielectric housing 14 so that the bottom of the solder tail is flush with bottom surface 48 of the housing. Generally fixed flat leg portion 68 of the terminal is shown fixed within groove 74 of the housing against side 58 of wall 56 of the housing. Spacer leg portion 76 of the terminal again projects outwardly from side 58 of the wall generally perpendicular thereto and generally perpendicular to fixed leg portion 68 of the terminal. Spring contact portion 78 of the terminal can be seen bowed about end face 62 of wall 56, with reverse bent lip 80 at the distal end of the spring contact portion being seated against reverse angled ledge 66 at side 60 of wall 56. It also can be seen that the lip is disposed in a groove 86 at side 60 of the wall. In this non-contacting condition, spring contact portion 78 of the terminal is preloaded due to the seating of lip 80 against ledge 66. In addition, because of the reversed bend of the lip and the reverse angle of the ledge, a sort of latching of the spring contact portion of the terminal is effected to resist flexing of the spring contact portion if engaged in a direction toward side 58 of wall 56. In other words, it can be seen in FIG. 1 how the spring contact portion 78 protrudes outwardly from a side 88 of dielectric housing 14. Should the spring contact portion be engaged by an extraneous object, such as in the direction of arrow "B" (FIG. 6), the latching of lip 80 beneath ledge 66 resists flexing of the spring contact portion which otherwise might destroy or alter the preload of the spring contact portion when such is unintentional.

In operation, element 90 in FIG. 6 represents a contact element of a mating connector component, such as a battery pad of a battery pack in a mobile telephone handset device. In such an application, connector 10 is mounted in the base unit of the mobile telephone device. The battery pack surface engages spring contact portion 78 in the direction of arrow "C". It should be noted that the contact element engages the spring contact portion at a point indicated at 92 which is generally on a tangent with the bowed curvature of the spring contact element. Continued downward force of contact element 90 in the direction of arrow "C" will cause spring contact portion 78 to flex to the dotted-line position. First of all, it can be seen that lip 80 has moved out of latched engagement behind reverse angled ledge 66 so that spring contact portion 78 can move laterally or to the right as viewed in the depiction. When the force of contact element 90 in the direction of arrow "C" moves the spring contact portion from the full-line position to the dotted-line position, spring contact portion 78 flexes in the direction of arrow "D", whereupon the contact element now engages the spring contact portion at a tangent point 94. The distance between original tangent point 92 and the "flexed" tangent point 94 represents the amount or length of relative wiping movement between contact element 90 and spring contact portion 78. It can be seen that the wiping length is considerable. When the force of contact element 90 is removed, spring contact portion 78 moves back from its dotted-line position to its full-line position in FIG. 6, and lip 80 again seats or latches behind reverse angled ledge 66.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an electrical connector which includes a dielectric body mounting a flexible leaf-type terminal which has a spring contact portion for surface engagement with a contact element of a mating connector component, the body including a partition-like wall defining oppositely facing sides and an end face thereof, the leaf-type terminal being fixed adjacent one side of the wall, and the spring contact portion of the terminal being bowed around the end face of the wall and spaced therefrom for flexingly surface engaging the contact element of the mating connector component in a given direction generally perpendicular to the end face of the wall, wherein the improvement comprises the terminal having a distal end at the end of the spring contact portion located in a recessed area in the other side of the wall to preload the spring contact portion and to resist flexing of the spring contact portion in a direction generally perpendicular to the end face of the wall if engaged in a direction generally toward the one side of the wall.

2. In an electrical connector as set forth in claim 1, wherein said recessed area in the other side of the wall comprises a notch defining a ledge extending into the wall at a reverse angle toward the end face of the wall.

3. In an electrical connector as set forth in claim 2, wherein the distal end of the terminal includes a lip portion bent inwardly and at an angle back toward the end face of the wall for seating against said ledge.

4. In an electrical connector as set forth in claim 1, wherein said terminal includes a generally flat leg portion fixed against said one side of the wall and a spacer leg portion projecting outwardly from the one side of the wall at an end of the flat leg portion, with the spring contact portion being bowed around the end face of the wall from an outer end of the spacer leg portion.

5. In an electrical connector as set forth in claim 4, wherein said flat leg portion and the distal end of the terminal are disposed in respective grooves respectively in the opposite sides of the wall.

6. An electrical connector assembly, comprising:

a dielectric body including a partition-like wall defining a base, oppositely facing sides, an end face and a reverse angle ledge formed in one of the oppositely facing sides; and a leaf-type terminal including a generally flat leg portion fixed against the other side of the wall, a spacer leg portion projecting outwardly from the other side of the wall at an end of the flat leg portion spaced from the base of the wall, a spring contact portion for surface engagement with a contact element of a mating connector component, the spring contact portion projecting from an outer end of the spacer leg portion in a bowed configuration around the end face of the wall and spaced therefrom for flexingly surface engaging the contact element of the mating connector component in a given direction generally perpendicular to the end face of the wall, and a lip at a distal end of the bowed spring contact portion, the lip being bent inwardly and at a reverse angle back toward the end face of the wall for seating beneath the ledge to preload the spring contact portion and to resist flexing of the spring contact portion if engaged by an extraneous object in a direction generally toward the other side of the wall.

7. The electrical connector of claim 6, wherein said flat leg portion and the lip portion of the terminal are disposed in respective grooves respectively in the opposite sides of the wall.

8. The electrical connector of claim 6, wherein the base of the wall includes a groove, and the terminal includes a solder tail portion disposed in the groove whereby the solder tail portion is generally flush with the base of the wall.

* * * * *